United States Patent
Kumar et al.

(10) Patent No.: US 10,817,373 B2
(45) Date of Patent: Oct. 27, 2020

(54) SOFT CHIP-KILL RECOVERY USING CONCATENATED CODES

(71) Applicant: SK Hynix Inc., Gyeonggi-do (KR)

(72) Inventors: Naveen Kumar, San Jose, CA (US); Aman Bhatia, San Jose, CA (US); Fan Zhang, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 92 days.

(21) Appl. No.: 16/151,064

(22) Filed: Oct. 3, 2018

(65) Prior Publication Data
US 2019/0155686 A1   May 23, 2019

Related U.S. Application Data

(60) Provisional application No. 62/589,471, filed on Nov. 21, 2017.

(51) Int. Cl.
| | |
|---|---|
| *G06F 11/10* | (2006.01) |
| *H03M 13/11* | (2006.01) |
| *G11C 16/08* | (2006.01) |
| *H03M 13/25* | (2006.01) |
| *G11C 29/42* | (2006.01) |
| *G11C 29/52* | (2006.01) |
| *G11C 7/10* | (2006.01) |
| *H03M 13/29* | (2006.01) |
| *G11C 8/10* | (2006.01) |
| *G11C 29/04* | (2006.01) |

(52) U.S. Cl.
CPC ...... *G06F 11/1068* (2013.01); *G06F 11/1012* (2013.01); *G11C 7/1006* (2013.01); *H03M 13/1105* (2013.01); *H03M 13/1111* (2013.01); *H03M 13/253* (2013.01); *H03M 13/255* (2013.01); *H03M 13/2906* (2013.01); *H03M 13/2927* (2013.01); *G11C 8/10* (2013.01); *G11C 16/08* (2013.01); *G11C 29/42* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 10,535,410 B2 * | 1/2020 | Cai | ............ G11C 29/44 |
| 2008/0244359 A1 | 10/2008 | Li et al. | |
| 2016/0306694 A1 | 10/2016 | Tai et al. | |
| 2019/0155688 A1 * | 5/2019 | Kumar | ............ H03M 13/2948 |

* cited by examiner

*Primary Examiner* — Phung M Chung
(74) *Attorney, Agent, or Firm* — Kilpatrick Townsend & Stockton LLP

(57) ABSTRACT

Techniques are described for memory writes and reads according to a chip-kill scheme that allows recovery of multiple failed wordlines. In an example, when writing data to a superblock of the memory, a wordline of the superblock stores "D+P" parity bits that protect "D" data bits of a codeword having a length of "2D+P." Other wordlines of the superblock store codewords each having a length of "D+P" (e.g., "D" data bits and "P" parity bits). If the decoding of any of these codewords of length "D+P" fails, the "D+P" parity bits are used to re-decode the failed wordline.

20 Claims, 9 Drawing Sheets

700

```
┌─────────────────────────────────────────────────────────────┐
│ Decode, in a first iteration, a first wordline and a second │
│ wordline with a first decoder 702                            │
└─────────────────────────────────────────────────────────────┘
                              │
                              ▼
┌─────────────────────────────────────────────────────────────┐
│         Determine that the decoding failed 704               │
└─────────────────────────────────────────────────────────────┘
                              │
                              ▼
┌─────────────────────────────────────────────────────────────┐
│ Decode "D" intermediary bits $D_{XOR}$ with a second decoder │
│ to generate "D" decoded intermediary bits $D'_{XOR}$ 706     │
└─────────────────────────────────────────────────────────────┘
                              │
                              ▼
┌─────────────────────────────────────────────────────────────┐
│ Decode, in a second iteration, the first wordline with the   │
│ first decoder based on soft information associated with the  │
│ second wordline and information associated with the "D"      │
│ decoded intermediary bits $D'_{XOR}$ 708                     │
└─────────────────────────────────────────────────────────────┘
                              │
                              ▼
┌─────────────────────────────────────────────────────────────┐
│ Decode, in the second iteration, the second wordline with    │
│ the first decoder based on soft information associated with  │
│ the first wordline and the information associated with the   │
│ "D" decoded intermediary bits $D'_{XOR}$ 710                 │
└─────────────────────────────────────────────────────────────┘
```

FIG. 7

SOFT CHIP-KILL RECOVERY USING CONCATENATED CODES

CROSS-REFERENCES TO RELATED APPLICATIONS

The present application claims priority to Provisional Application No. 62/589,471 entitled "SOFT CHIP-KILL RECOVERY USING CONCATENATED CODES," filed Nov. 21, 2017, which is assigned to the assignee hereof and expressly incorporated by reference herein in its entirety.

BACKGROUND

Data integrity is an important feature for any data storage device and data transmission. Use of strong error-correction codes (ECCs) is recommended for various types of data storage devices include NAND flash memory devices. ECCs are also frequently used during the process of data transmission.

Error correcting code (ECC) refers to codes that add redundant data, or parity data, to a message, such that the message can be recovered by a receiver even when a number of errors were introduced, either during the process of transmission, or storage. In general, the ECC can correct the errors up to the capability of the code being used. Low-density parity-check code (LDPC) is an example of ECC.

In a data storage device, such as a NAND flash memory device, data can be written to and read from wordlines and bitlines of the data storage device. Wordline and bitline failures are quite common in NAND. In existing systems, there are various techniques to handle these failures. Typically, the data bits are decoded with a decoder, such as an LDPC decoder. If the decoding fails, a chip-kill parity is used. Chip-kill refers to an ECC computer memory technology that protects against memory failures. Chip-kill parity relies on storing an XOR of the data bits and, upon a failure of the LDPC decoder, using the XOR'ed data bits to derive the failed code.

However, in these systems, decoding failures can be caused by a number of errors that are beyond the LDPC decoder's error correction capability. In these situations, the chip-kill parity may not allow recovery of the failed bits. Thus, the chip-kill may fail to provide the desired protection.

BRIEF SUMMARY

Techniques are described for memory writes and reads according to a chip-kill scheme that allows recovery of multiple failed wordlines. In an example, a computer system generates "D" intermediary data bits by at least performing one or more XOR operations on data bits from wordlines of a superblock. The wordlines comprise a first wordline and a second wordline. The superblock comprises a first block on a first memory die and a second block on a second memory die. The first block comprises the first wordline. The second block comprises the second wordline. Each of the first wordline and the second wordline is configured to store "D" data bits and "P" parity bits protecting the "D" data bits. Each of "D" and "P" is a positive integer greater than or equal to one. The computer system generates "K" parity bits that protect the "D" intermediary data bits. "K" is equal to the sum of "D" and "P". The computer system stores the "K" parity bits in an additional wordline of the superblock other than the wordlines. Further, the computer system outputs decoded data bits from the superblock based on a decoding procedure that uses the "K" parity bits stored in the additional wordline.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 7 illustrates an example flow for recovering multiple failed wordlines from a superblock, in accordance with certain embodiments of the present disclosure.

DETAILED DESCRIPTION

Figure 1:
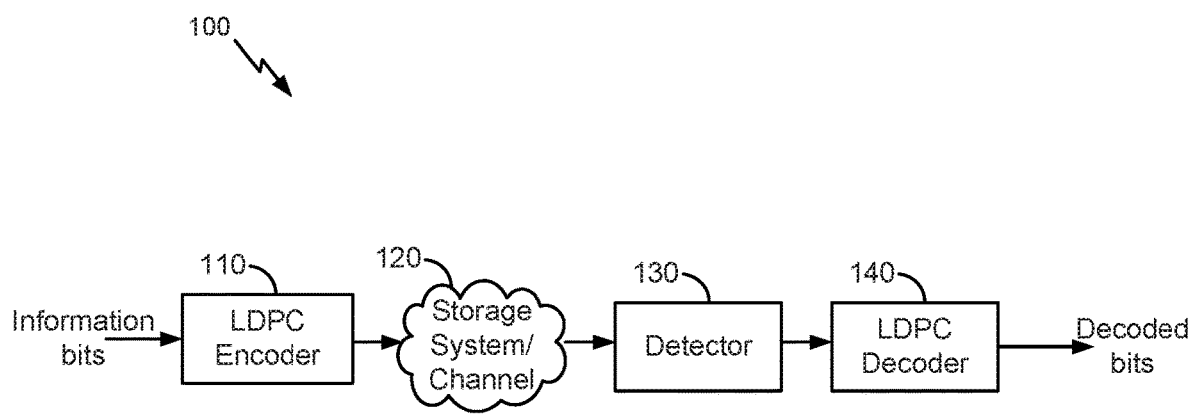
FIG. 1 illustrates an example high level block diagram of an error correcting system, in accordance with certain embodiments of the present disclosure.

Embodiments of the present disclosure involve improving memory reads of a computer system. In an example, data is written to a storage device of the computer system, such as to a NAND flash memory device. The data is read from memory based on a decoding of bits stored in wordlines and bitlines of the memory. Wordline and bitline failures are detected early and further usage of the failed wordline(s) and bitline(s) is avoided in the decoding of the data by a decoder (e.g., an LDPC decoder) of the computer system. Unlike existing chip-kill parity, an additional ECC code is generated from the stored data bits and the parity bits of this ECC code are stored in the memory. This ECC code has a much higher error correction capability because its code rate is relatively low. The stored parity bits are used to decode the failed wordline(s) and bitline(s) and recover the data. Accordingly, decoding multiple failed worldine(s) and bitline(s) having failures beyond the decoder's error correction capability becomes possible, thereby improving the memory reads relative to existing chip-kill parity.

In an example, a superblock of the storage device includes "N" wordlines distributed across multiple blocks of the superblock, where "N" is a positive integer greater than one. Data is written to "N−1" wordlines of the superblock. Writing the data includes encoding the data using an LDPC encoder, or some other ECC encoder. Let "D" and "P" denote data length and parity length, respectively, of the LDPC codeword stored in each of the "N−1" wordlines (or, as applicable, any other ECC codeword generated depending on the ECC encoder). Each of these LDPC codewords has a length of "D+P" and its code rate is "D/(D+P)." The data portions of the "N−1" wordlines are XOR'ed to generate "D" intermediary data bits $D_{XOR}$. A different LDPC codeword (or any other ECC codeword) is generated by protecting the "D" intermediary data bits $D_{XOR}$ with "D+P" parity bits. This codeword has a length of "2D+P" and its code rate is "D/(2D+P)." The "D+P" parity bits are stored in the last wordline of the superblock. In comparison, existing chip-kill parity would amount to the XOR of the "N−1" wordlines and would have a code rate of "D/(D+P)." Because the different codeword has a higher code rate (e.g., "D/(2D+P)" compared to "D/(D+P)"), this codeword is in effect an improved chip-kill parity that can be used to more successfully decode the failed wordline(s), thereby improving the memory reads.

In the interest of clarity of explanation, embodiments of the present disclosure are described in connection with LDPC codewords. Nonetheless, the embodiments similarly apply to other types of ECC codewords. In particular, a targeted type(s) of ECC codeword can be used by implementing equivalent ECC encoder(s) and decoder(s). In also the interest of clarity of explanation, the embodiments are described in connection with failed wordlines. Nonetheless, the embodiments similarly apply to failed bitlines, whereby a different ECC codeword (e.g., having a longer length) can be generated and its parity bits stored and used in the decoding of the failed bitlines.

FIG. 1 illustrates an example high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically the edge connections are chosen at random. The error correction capability of an LDPC code is improved if cycles of short length are avoided in the graph. In a (r,c) regular code, each of the n variable nodes (V1, V2, ..., Vn) has connections to r check nodes and each of the m check nodes (C1, C2, ..., Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes. The connections between variable nodes and check nodes are described by and correspond to the values of the parity-check matrix.

In an example, a hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. This step can be referred as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes, also include reliability of each bit.

In another example, a soft message passing algorithm may be performed. In this example, $L(q_{ij})$ represents a message that is sent by variable node $v_i$ to check node $c_j$; $L(r_{ji})$ represents the message sent by check node $c_j$ to variable node $v_i$; and $L(c_i)$ represents initial LLR value for each variable node $v_i$. Variable node processing for each $L(q_{ij})$ can be done through the following steps:

(1) Read $L(c_i)$ and $L(r_{ji})$ from memory.
(2) Calculate $L(Qi\text{-sum}) = L(c_i) + \text{Scaling Factor} * \Sigma_{j' \in c_i} L(r_{ij})$
(3) Calculate each $L(Qi\text{-sum}) - L(r_{ji})$.
(4) Output $L(Qi\text{-sum})$ and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each L(rji) can be performed as follows:

(1) Read one row of qij from memory.
(2) Calculate L(Rj-sum) as follows:

$$L(Rj - \text{sum}) = \left(\prod_{i' \in R_j} \alpha_{i'j}\right) \emptyset\left(\sum_{i' \in R_j} \emptyset(\beta_{i'j})\right)$$

$$\alpha_{ij} = \text{sign}(L(q_{ij})), \beta_{ij} = |L(q_{ij})|,$$

$$\emptyset(x) = -\log\left(\tanh\left(\frac{x}{2}\right)\right) = \log\left(\frac{e^x + 1}{e^x - 1}\right)$$

(3) Calculate the individual $L(r_{ji}) = (\pi_{i' \in R_{j\setminus i}} \alpha_{i'j}) \emptyset (\Sigma_{i' \in R_{j\setminus i}} \emptyset(\beta_{i'j}))$ for check nodes.
(4) Write back $L(r_{ji})$ to memory.
(5) If this is not the last row of memory, then go to the first step and increment j by one.

Figure 2:
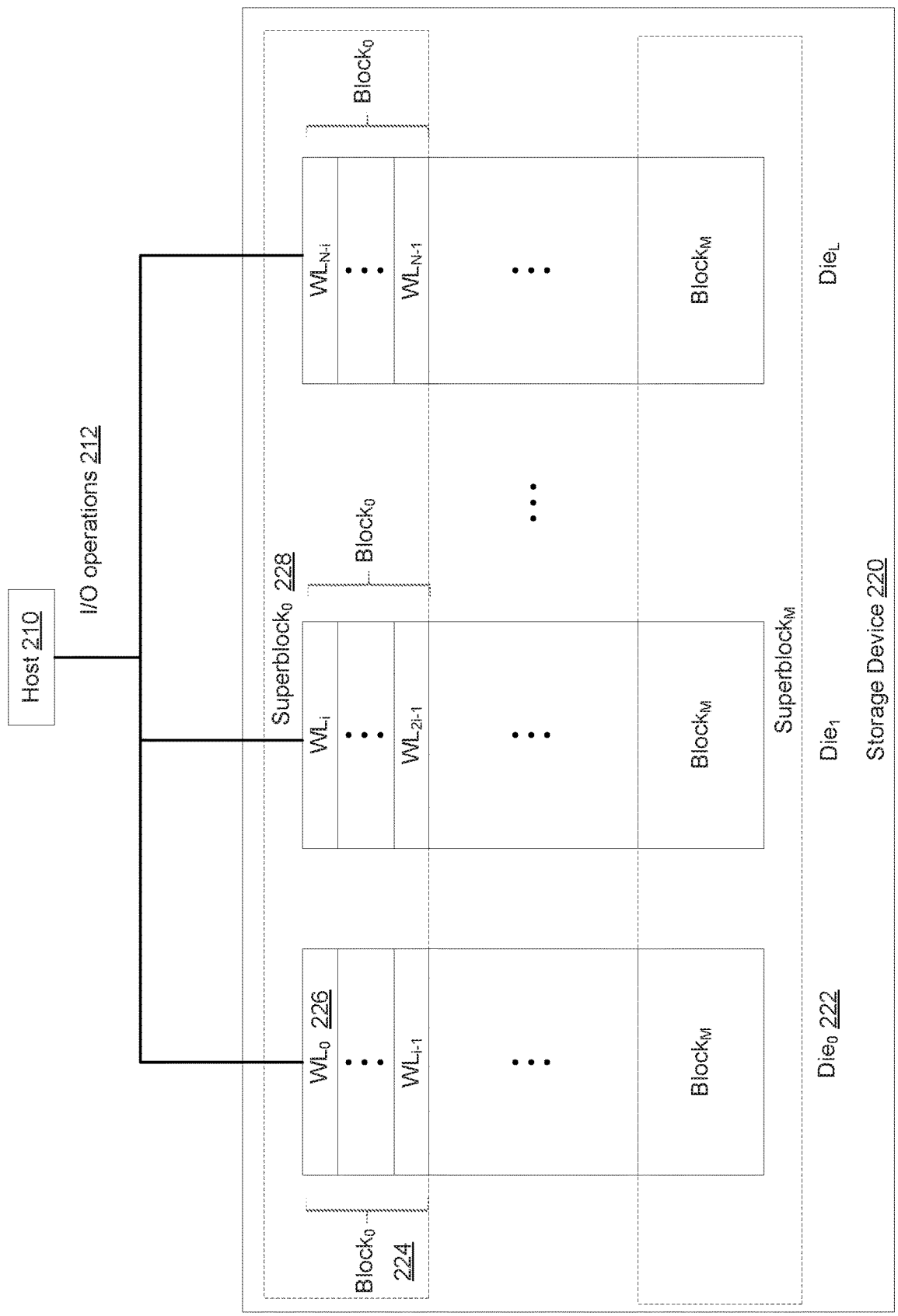
FIG. 2 illustrates an example of a computer system that includes a host and a storage device, in accordance with certain embodiments of the present disclosure.

FIG. 2 illustrates an example of a computer system that includes a host 210 and a storage device 220, in accordance with certain embodiments of the present disclosure. The host 210 performs I/O operations 212 including writing data to the storage device 220 and reading data from the storage device 220. In an example, writing the data includes encoding the data with one or more LDPC encoders (not shown in FIG. 2) to generate LDPC codewords that are stored in the storage device 220. Reading the data includes decoding the LDPC codewords with one or more LDPC decoders (not shown in FIG. 2) to output decoded data from the storage device 220. The encoding and decoding (e.g., the LDPC encoder(s) and decoder(s)) are part of an ECC system that can be implemented between the host 210 and the storage device 220.

In an example, the storage device 220 includes a number of memory dies 222 (this number is shown as "L" in FIG. 2). In turn, each memory die 222 includes a number of blocks 224 (this number is shown as "M" in FIG. 2), each of which contains a number of wordlines 226 (this number is shown as "i" in FIG. 2). Superblock 228 are formed and each contains a block 224 from each die 222.

As illustrated, superblock "0" includes the blocks "0" across the different dies 222. Block "0" of die "0" and belonging to superblock "0" includes wordlines "0" through "i-1." Accordingly, superblock "0" contains "N" wordlines, illustrated as wordline "0" through wordline "N-1."

Each of the wordlines is configured to store a number of data bits, such as sixteen kilobytes of data. Within each superblock, wordline "0" through wordline "N-2" store LDPC codewords corresponding to the data written by the host 210 (e.g., information bits). Wordline "N-1" (e.g., the last wordline) stores chip-kill parity data bits according to the embodiments of the present disclosure. Although the last wordline is illustrated, the chip-kill parity data bits can be stored instead in any other wordline of the superblock. Generally, the superblock includes wordlines and an additional wordline (e.g., wordlines "0" through "N–2" and wordline "N–1"). The wordlines store LDPC codewords corresponding to the information bits. The additional wordline stores the chip-kill parity bits.

Figure 3:
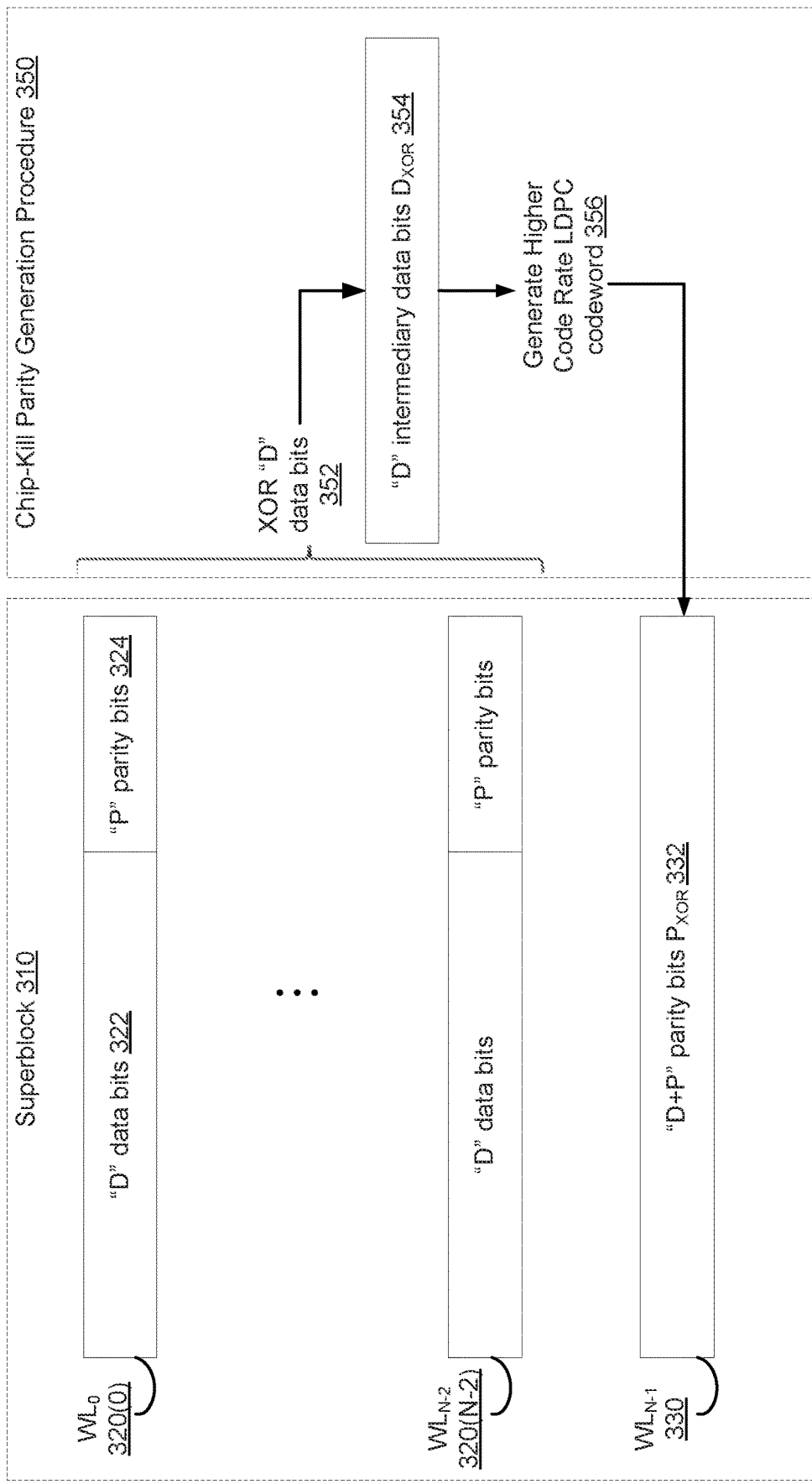
FIG. 3 illustrates an example of writing data to a superblock of a storage device, in accordance with certain embodiments of the present disclosure.

FIG. 3 illustrates an example of writing data to a superblock 310 of a storage device (such as to the superblock "0" of the storage device 220 of FIG. 2), in accordance with certain embodiments of the present disclosure. The superblock 310 is shown on the left side of FIG. 3. A procedure 350 for generating chip-kill parity is shown on the right side of FIG. 3.

As illustrated, the superblock 310 includes multiple wordlines that store LDPC codewords generated based on information bits. These wordlines are labeled 320(0) through 320(N–2) in FIG. 3. Each of the LDPC codewords includes "D" data bits 322 corresponding to a portion of the information bits, and "P" parity bits 324 that protect the "D" data bits. Each of "D" and "P" is a positive integer greater than or equal to one. Accordingly, each LDPC codeword has a length of "D+P" and can be generated by a first LDPC encoder.

The superblock 310 also includes an additional wordline 330 (shown as wordline "N–1") that stores "D+P" parity bits $P_{XOR}$ 332. In an example, $P_{XOR}$ 332 has a length of "D+P" and is a set of parity bits that correspond to chip-kill parity generated according to the procedure 350.

To generate $P_{XOR}$ 332, the procedure 350 includes multiple steps. In a first step of the procedure 350, one or more XOR operations are applied to the data portions (rather than the parity portions) of the wordlines of the superblock 310 (e.g., the "D" data bits stored in the wordlines 320(0) through 320(N–2) are XOR'ed). The XOR of the "D" data bits across the wordlines 320(0) through 320(N–2) is a "D" intermediary data bits $D_{XOR}$ 354. $D_{XOR}$ 354 has a length of "D" and is a set of data bits that correspond to the XOR of the "D" data bits across the wordlines of the superblock 310.

In a second step of the procedure 350, a lower code rate LDPC codeword 356 is generated. This codeword 356 can be generated by a second LDPC encoder different than the first LDPC encoder. In particular, the "D" intermediary data bits $D_{XOR}$ 354 are protected with the "D+P" parity bits $P_{XOR}$ 332 to form the higher rate LDPC codeword 356. Accordingly, the lower code rate LDPC codeword 356 has a length of "2D+P" and a code rate of "D/(2D+P)" (whereas the LDPC codewords stored in the wordlines have a shorter length of "D+P" and a higher code rate of "D/(D+P)").

In an example, once the lower rate LDPC codeword 356 is generated, the "D+P" parity bits $P_{XOR}$ 332 are stored in the additional wordline 330 of the superblock 310. The "D" intermediary data bits $D_{XOR}$ 354 need not be stored and, as needed during the decoding, can be generated again on the fly.

Figure 4:
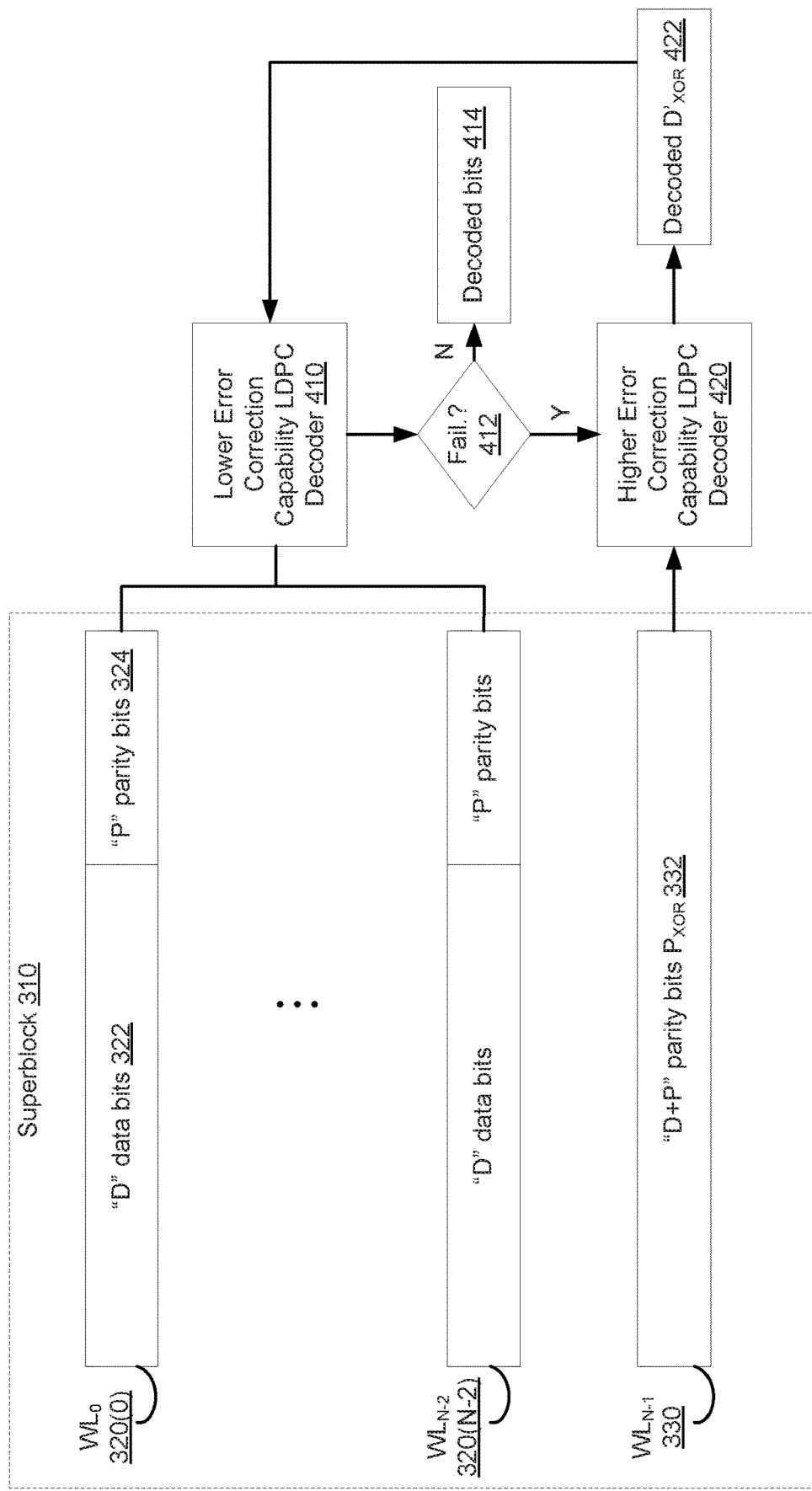
FIG. 4 illustrates an example of reading data from a superblock of a storage device, in accordance with certain embodiments of the present disclosure.

FIG. 4 illustrates an example of reading data from the superblock 310, in accordance with certain embodiments of the present disclosure. Reading the data includes decoding the data by a first LDPC decoder 410 (illustrated as a lower error correction capability LDPC decoder) and, as needed to recover failures, using a second LDPC decoder 420 (illustrated as a higher error correction capability LDPC decoder).

In an example, the first LDPC decoder 410 decodes the LDPC codewords stored in the wordlines 320(0) through 320(N–2) of the superblock 310. Accordingly, the error correction capability of this first LDPC decoder 410 is associated with the code rate "D/(D+P)" of these codewords. The second LDPC decoder 420 decodes the lower rate LDPC codeword 356 based on the "D+P" parity bits $P_{XOR}$ 332 stored in the wordline "N–1" 330 of the superblock 310. In this case, the "D" intermediary data bits $D_{XOR}$ 354 are generated on the fly by XORing the data portions of the wordlines 320(0) through 320(N–2) and the LDPC decoder 420 performs the decoding on $D_{XOR}$ 354 and $P_{XOR}$ 332. Accordingly, the error correction capability of the second LDPC decoder 420 is associated with the code rate "D/(2D+P)" of the lower rate LDPC codeword 356 and, thus, is higher than the error correction capability of the first LDPC decoder 410.

As illustrated, the first LDPC decoder 410 decodes the LDPC codewords stored in the wordlines 320(0) through 320(N–2). If one or more decoding failures 412 are detected, the second LDPC decoder 420 is used to recover the failures. Otherwise, decoded bits 414 by the first LDPC decoder 410 are an output from the superblock 310.

A decoding failure is detected when, for example, the number of error bits in a wordline (e.g., in the decoded bits of the LDPC codeword stored in the wordline) is larger than the error correction capability of the first LDPC decoder 410. This wordline can be declared as a failed wordline. The number of error bits can be an output of the first LDPC decoder 410 and correspond, for example, to the number of unsatisfied check nodes.

If one or more failed wordline(s) are detected, the second LDPC decoder 420 decodes the lower rate LDPC codeword 356 and outputs "D" decoded intermediary data bits D'$_{XOR}$ 422. The decoded D'$_{XOR}$ 422 (e.g., the hard bits) or soft information about the decoded D'$_{XOR}$ 422 available from the second LDPC decoder 420 are provided to the first decoder 410 to re-attempt the decoding of the failed wordline(s). This process can be iteratively repeated until all failed wordline(s) are recovered or until a maximum number of iterations is reached.

Accordingly, if there are "T" codewords failing in a superblock in soft decoding by a lower error correction capability LDPC decoder, soft information can be updated using a higher error correction capability LDPC decoder. Out of "T" codewords failing from the lower error correction capability LDPC decoder, "T1" codewords have converging and "T2" codewords have diverging decoding, where "T=T1+T2," "T1≤T" and "T2≤T." Converging decoding typically has a number of unsatisfied check nodes that is reduced based on the soft information update, whereas diverging decoding typically has a number of unsatisfied check nodes that is increased based on the soft information update. While constructing XOR parity information, soft information from diverging codewords is avoided and channel information is used. By exploiting this information, the number of errors in XOR data is significantly reduced. The higher error correction capability LDPC decoder is a strong decoder and it can easily correct these errors and update soft information of bits appropriately. This information can be further used to correct bits in the failed codewords. This decoding can be performed iteratively until the data is recovered successfully.

Figure 5:
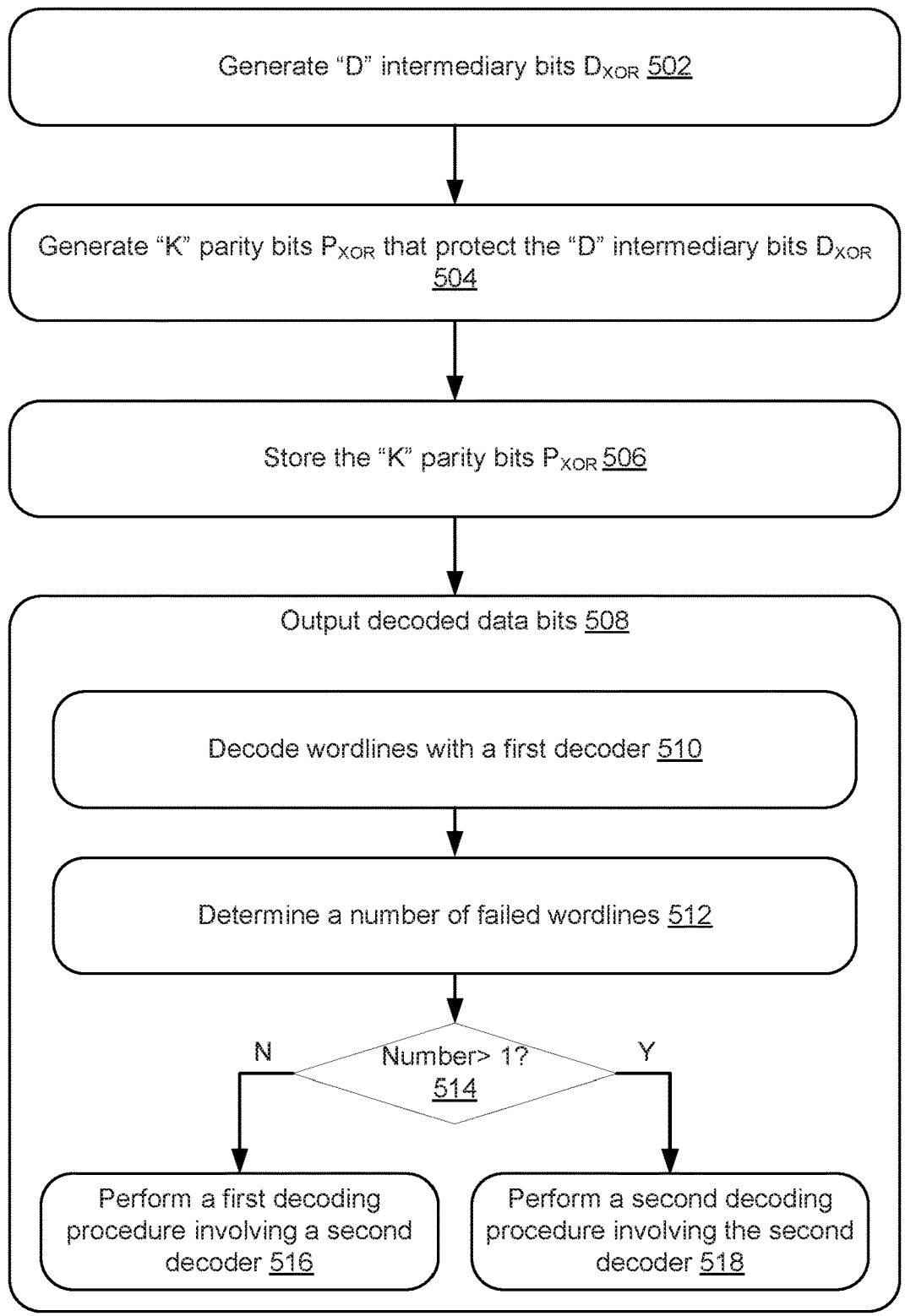
FIG. 5 illustrates an example flow for writing data to and reading data from a superblock of a storage device, in accordance with certain embodiments of the present disclosure.

FIG. 5 illustrates an example flow 500 for writing data to and reading data from a superblock of a storage device, in accordance with certain embodiments of the present disclosure. A computer system is described as performing particular operations of the example flow 500. This computer system includes the storage device and an LDPC system, although any other ECC system can similarly be used. The LDPC system may have a specific hardware configuration to perform operations illustrated in the example flow 500. Alternatively or additionally, the LDPC system may include generic hardware configured with specific instructions. In an example, the computer system includes one or more processors and one or more memories, including the data storage device. The memory(ies) stores computer-readable instructions to embody functionalities specific to the LDPC system. The instructions when executed by the processor(s) of the computer system result in performance of the operations. The instructions stored in the memory(ies) in conjunction with the underlying processor(s) represent a means for performing the operations. Although the operations are illustrated in a particular order, other arrangements of the operations are possible and some of the operations may be skipped as it would be apparent to a person skilled in the art.

In the interest of clarity of explanation, the example flow 500 is illustrated using a first wordline and a second wordline of a superblock, where these two wordlines store LDPC codewords that encode information bits. However, the superblock can contain a larger number of wordlines that store such LDPC codewords. Further, the superblock contains an additional wordline that stores "D+P" parity bits $P_{XOR}$.

As illustrated, the example flow 500 starts at operation 502, where the computer system generates "D" intermediary data bits $D_{XOR}$ by at least performing one or more XOR operations on data bits from wordlines of a superblock. In an example, the $D_{XOR}$ is the XOR of the data bits from these wordlines. The wordlines store LDPC codewords that encode information bits and include a first wordline and a second wordline. The superblock includes a first block on a first memory die of the storage device and a second block on a second memory die of the storage device. The first block includes the first wordline. The second block includes the second wordline. Each of the first wordline and the second wordline is configured to store "D" data bits and "P" parity bits protecting the "D" data bits such that the wordline store one of the LDPC codewords. Each of "D" and "P" is a positive integer greater than or equal to one.

At operation 504, the computer system generates "K" parity bits $P_{XOR}$ that protect the "D" intermediary data bits $D_{XOR}$, where "K" is equal to the sum of "D" and "P". In an example, an LDPC encoder generates a lower code rate LDPC codeword that encodes "D" intermediary data bits $D_{XOR}$. The parity bits of this codeword are the "K" parity bits $P_{XOR}$.

At operation 506, the computer system stores the "K" parity bits $P_{XOR}$ in an additional wordline of the superblock other than the wordlines. In an example, this additional wordline is the last wordline (or some other wordline) of the superblock in which no LDPC codeword encoding information bits was stored.

At operation 508, the computer system outputs decoded data bits from the superblock based on a decoding procedure that uses the "K" parity bits stored in the additional wordline. As illustrated, operation 508 may include multiple sub-operations 510-518.

At sub-operation 510, the computer system decodes the wordlines of the superblock with a first decoder. In an example, the first decoder is a lower error correction capability LDPC decoder associated with a code rate of "D/(D+P)." Each of the wordlines (e.g., the stored LDPC codeword in that wordline) is input to this LDPC decoder. An output is a decoded wordline.

At sub-operation 512, the computer system determines a number of failed wordlines. In an example, each decoded wordline is associated with a number of errors. For instance, the first decoder also outputs a number of unsatisfied check nodes for each decoded wordline. If that number exceeds the error correction capability of the first decoder, the corresponding decoded wordline is a failed wordline. The computer system tracks the number of such failed wordlines.

At sub-operation 514, the computer system determines whether the number of the failed wordlines is one, greater than one, or zero. Upon determining that the number is one, operation 516 follows operation 514. Upon determining that the number is greater than one, operation 518 follows operation 514 instead. Upon determining that the number is zero, the decoding of all the wordlines was successful and the decoded bits are outputted.

At sub-operation 516, the computer system performs a first decoding procedure that does not rely on soft information of other wordlines. At this sub-operation, only one failed wordline exists. Assume that this wordline is the first wordline to illustrate this decoding procedure. The first wordline is detected to be a failed wordline by determining that a number of error bits in the first wordline is larger than a threshold (e.g., such as larger than the error correction capability of the first decoder). Based on the number of error bits being larger than the threshold, the computer system decodes the first wordline with a second decoder. The second decoder is associated with a higher error correction capability than the first decoder. For instance, this second decoder has a higher error correction capability LDPC decoder (where "higher" and "lower" are used to refer to relative error correction capabilities of the two decoders). The second decoder outputs "D" decoded intermediary data bits $D'_{XOR}$, that are then used to re-decode the first wordline. This re-decoding does not involve the soft information of the other wordlines and, instead, includes XOR operations. A further example of this first decoding procedure is illustrated in connection with FIG. 6.

To output the "D" decoded intermediary data bits $D'_{XOR}$, the computer system generates "D" intermediary data bits $D_{XOR}$ again by at least re-performing the one or more XOR operations. The "D" intermediary data bits $D_{XOR}$ and the already stored "K" parity bits form the lower code rate LDPC codeword. This codeword is input to the second decoder. An output of the second decoder is the "D" decoded intermediary data bits $D'_{XOR}$.

At sub-operation 518, the computer system performs a second decoding procedure that relies on soft information of one or more other failed wordlines. At this sub-operation, multiple failed wordlines exist. Assume that the wordlines include the first wordline and the second wordline to illustrate this decoding procedure. Here also, the second decoder is used to output the "D" decoded intermediary data bits $D'_{XOR}$. Soft information or hard information about the "D" decoded intermediary data bits $D'_{XOR}$ are provided to the first decoder. To decode the first wordline (which is a failed one), soft information about the second wordline (which is also a failed one) and, optionally, about other failed wordlines is also provided to the first decoder. In addition, existing soft information about the first wordline is erased (e.g., its LLR is set to zero). The first decoder then decodes the first wordline based on the information (hard or soft) about the "D" decoded intermediary data bits $D'_{XOR}$ and the soft information about the one or more other failed wordlines. The same can be performed for the second wordline, where its decoding erases its soft information and uses the soft information about the first wordline instead. A further example of this first decoding procedure is illustrated in connection with FIGS. 7 and 8.

Figure 6:
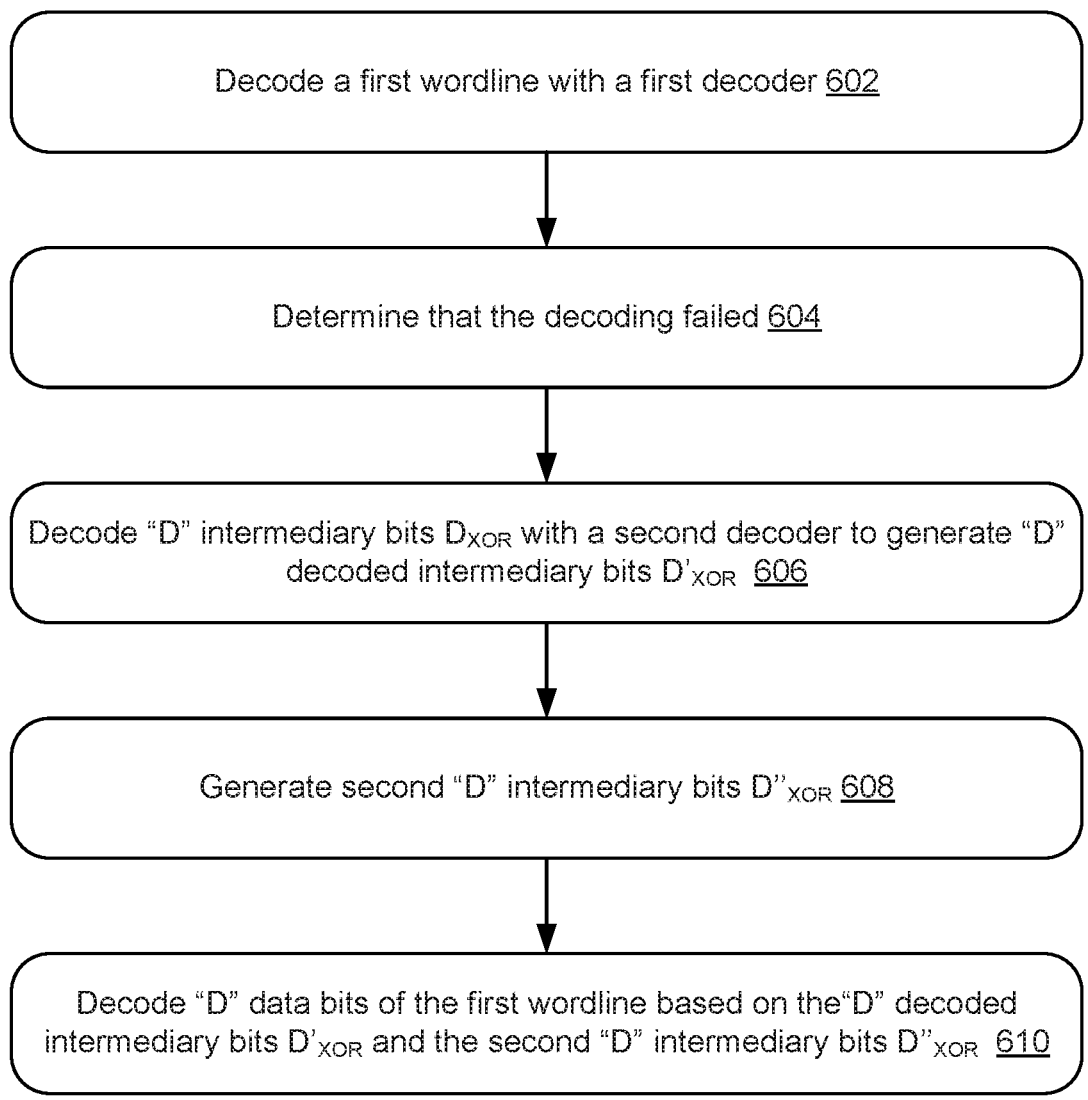
FIG. 6 illustrates an example flow for recovering a wordline from a superblock when that wordline is the only failed wordline, in accordance with certain embodiments of the present disclosure.

FIG. 6 illustrates an example flow 600 for recovering a wordline from a superblock when that wordline is the only failed wordline, in accordance with certain embodiments of the present disclosure. In the example flow 600, the first wordline described herein above in connection with the example flow 500 is used as the failed wordline for illustrative purposes.

The example flow 600 starts at operation 602, where the computer system decodes the first wordline with the first decoder. At operation 604, the computer system determines that the decoding of the first wordline with the first decoder failed. In an example, when the number of error bits exceeds the error correction capability of the first decoder, the computer system declares that the decoding of the first wordline failed. In addition, the computer system determines that this first wordline is the only failed wordline upon completion of the decoding of the remaining wordlines of the superblock.

At operation 606, the computer system decodes the "D" intermediary data bits with the second decoder based on the "K" parity bits stored in the additional wordline of the superblock to generate the "D" decoded intermediary bits $D'_{XOR}$.

At operation 608, the computer system generates a second "D" intermediary data bits $D''_{XOR}$ by at least performing one or more XOR operations on a subset of the wordlines of the superblock, where the subset excludes the first wordline. In an example, the superblock includes "N" wordlines. Wordlines "0" through "N-2" store the LDPC codewords that encode the information bits. Wordline "N-1" stores the "K" parity bits. In this example, the first wordline corresponds to wordline "0" (or any one of the wordlines "1" through "N-2;" wordline "0" is used for illustrative purposes). Data bits across the wordlines "1" through "N-2" are XOR'ed to generate the "D" intermediary data bits $D''_{XOR}$. In other words, the first wordline is removed from the wordlines that store LDPC codewords to create the subset of wordlines and the "D" intermediary data bits $D''_{XOR}$ is the XOR of the data portions in this subset.

At operation 610, the computer system decodes the "D" data bits of the first wordline based on the "D" decoded intermediary data bits $D'_{XOR}$ and the second "D" intermediary data bits $D''_{XOR}$. In an example, the computer system XOR's the $D'_{XOR}$ and $D''_{XOR}$. Accordingly, the "D" data bits of the first wordline are the XOR of $D'_{XOR}$ and $D''_{XOR}$ and are output as decoded bits of the first wordline.

FIG. 7 illustrates an example flow 700 for recovering multiple failed wordlines from a superblock, in accordance with certain embodiments of the present disclosure. In the example flow 700, the first wordline and the second wordline described herein above in connection with the example flow 500 are used as the failed wordlines for illustrative purposes.

The example flow 700 starts at operation 702, where the computer system decodes, in a first iteration, the first wordline and the second wordline with the first decoder. At operation 704, the computer system determines that the decoding of the first wordline and the second wordline with the first decoder failed. In an example, the decoding of each of these wordlines is determined to have failed when the error bits in each of the decoded wordline is larger than a threshold (e.g., exceeds the error correction capability of the first decoder).

At operation 706, the computer system decodes the "D" intermediary data bits with the second decoder based on the "K" parity bits stored in the additional wordline of the superblock to generate the "D" decoded intermediary bits $D'_{XOR}$.

At operation 708, the computer system decodes, in a second iteration (e.g., an iteration subsequent to the first iteration), the first wordline with the first decoder based on soft information associated with the second wordline and information associated with the "D" decoded intermediary data bits $D'_{XOR}$. In an example, the soft information associated with the second wordline is an output from the first decoder in the first iteration. The information associated with the "D" decoded intermediary data bits is available from the second decoder and can log likelihood ratios (LLRs) and/or hard information of the "D" decoded intermediary data bits $D'_{XOR}$. In addition, this operation includes erasing soft information (e.g., setting the LLRs to zero) that is associated with the first wordline and that is another output of the first decoder in the first iteration.

Accordingly, in the second iteration, the first decoder erases the soft information available from the previous iteration about the first wordline, has the soft information available from the previous iteration about the second wordline, and has the information about $D'_{XOR}$. The second decoder then re-decodes the first codeword in the second iteration. If after this decoding, the number of errors in the decoded first wordline increases (e.g., the corresponding number of unsatisfied check nodes increases), the decoding of the first wordline has diverged. In this case, the soft information available from the second iteration about the first wordline is erased and the soft information available from the previous iteration about the first wordline is re-used in, for instance, the decoding of the second wordline in the second iteration. On the other hand, if after this decoding, the number of errors in the decoded second wordline decreases, the decoding of the first wordline has converged. In this case, the soft information available from the second iteration about the first wordline is retained and used in, for instance, the decoding of the second wordline in the second iteration.

At operation 710, the computer system decodes, in the second iteration and subsequent to the decoding of the first wordline in the second iteration, the second wordline with the first decoder based on soft information associated with the first wordline and the information associated with the "D" decoded intermediary data bits $D'_{XOR}$. The soft information associated with the first wordline is another output from the first decoder in the second iteration and depends on whether the decoding of the first wordline converged or diverged as explained above. Accordingly, in the second iteration, the first decoder erases the soft information available from the previous iteration about the second wordline, has the soft information about the first wordline (depending on its decoding convergence or divergence), and has the information about $D'_{XOR}$. The second decoder then re-decodes the second codeword in the second iteration. Here also, depending on whether this re-decoding converges or diverges, the soft information about the second wordline available from the previous iteration (e.g., the first iteration) would be retained (e.g., in case of divergence) or the soft information about the second wordline available from the current iteration (e.g., the second iteration) would be retained (e.g., in case of convergence).

In an example, operations 708-710 are iteratively repeated until the two wordlines are successfully decoded or until a maximum number of iterations is reached.

Figure 8:
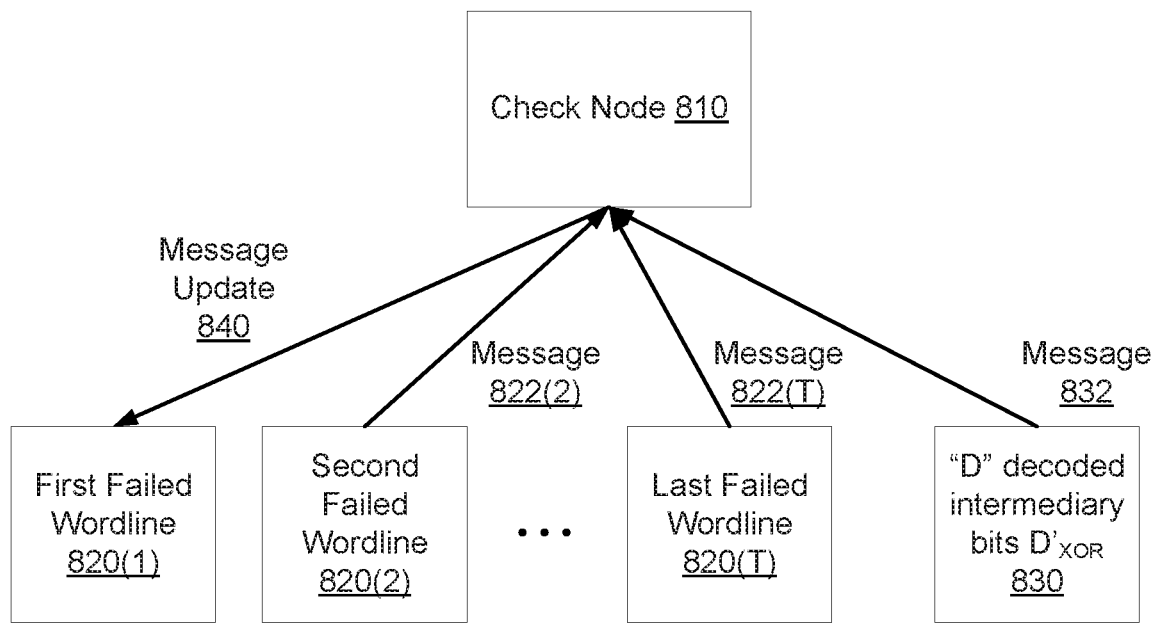
FIG. 8 illustrates an example decoding of multiple failed wordlines, in accordance with certain embodiments of the present disclosure.

FIG. 8 illustrates an example decoding of multiple failed wordlines, in accordance with certain embodiments of the present disclosure. More specifically, FIG. 8 provides visualization of the iterative decoding using operations 708-710 of FIG. 7.

As illustrated, a check node update (CNU) that uses a message passing algorithm, such as an MS or an SPA algorithm, can be used. Each failed wordline (shown as wordlines 820(1), 820(2) through 820(T)) corresponds to a variable node connected. "D" decoded intermediary data bits $D'_{XOR}$ 830 also corresponds to a variable node. Theses variable nodes are connected to a check node 810.

To decode the first failed wordline 820(1) with the first decoder (e.g., the lower error correction capability decoder), a message update 840 is passed from the check node 810 to the first decoder. This message update 840 is generated based on the message passing algorithm. In particular, a message is provided to the check node 810 from each of the remaining variable nodes corresponding to the remaining failed wordlines 820(2) through 820(T) and $D'_{XOR}$ 830. Each message includes soft or hard information about the corresponding variable node. As such, a message 822(2) includes soft information or hard information about the second failed wordline 820(2). Similarly, a message 822(T) includes soft information or hard information about the last failed wordline 820(T). A message 832 includes soft information or hard information about $D'_{XOR}$ 830. The message passing algorithm is used to generate the message update 840 from the messages 822(2) through 822(T) and the message 832.

When decoding the first failed wordline 820(1), the first decoder uses the message update 840. In addition, existing soft or hard information about the first wordline 820(1) can be erased. Alternatively, this existing information and the message update 840 can be each weighted and used in combination in the decoding of the first failed wordline 820(1).

Figure 9:
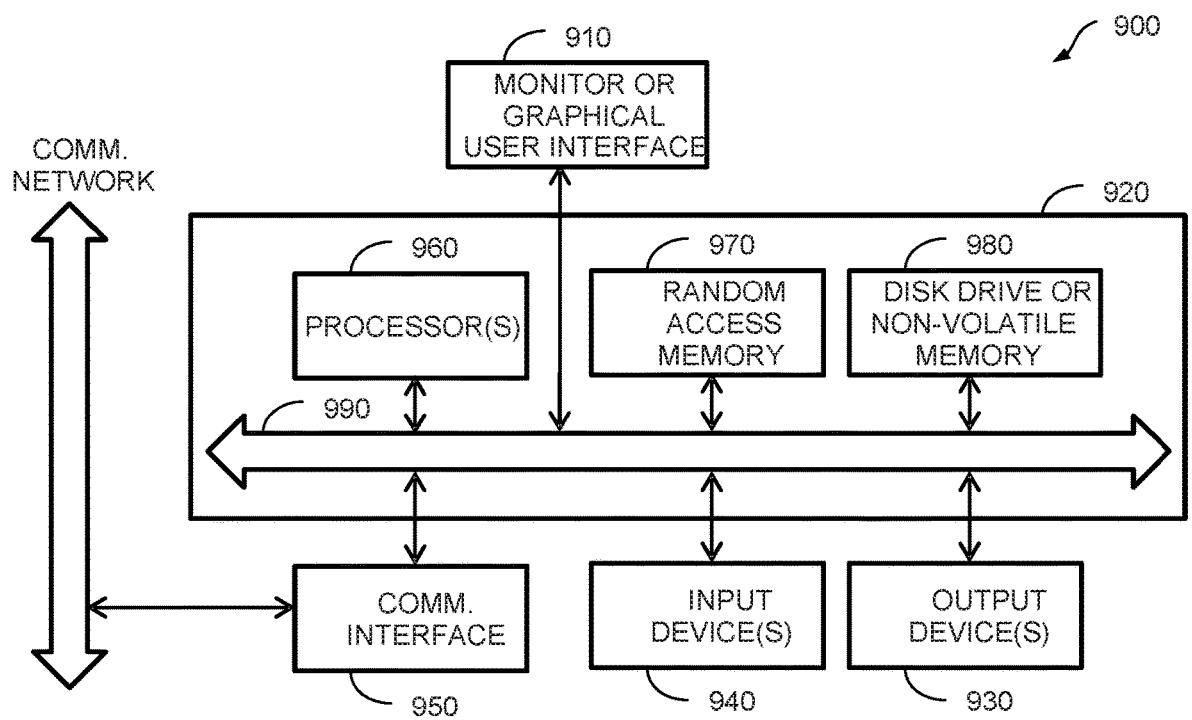
FIG. 9 illustrates one potential implementation of a system which may be used, according to certain embodiments of the present disclosure.

FIG. 9 illustrates one potential implementation of a system which may be used, according to certain embodiments of the present disclosure. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and disk drive 980.

The user input devices 930 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 930 are typically embodied as a computer mouse, a trackball, a track pad, a joystick, wireless remote, drawing tablet, voice command system, eye tracking system, and the like. The user input devices 930 typically allow a user to select objects, icons, text and the like that appear on the monitor 910 via a command such as a click of a button or the like.

The user output devices 940 include all possible types of devices and mechanisms for outputting information from the computer 920. These may include a display (e.g., the monitor 910), non-visual displays such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, one embodiment, the computer 920 includes a UNIX-based operating system.

The RAM 970 and the disk drive 980 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the disk drive 980 may be configured to store the basic programming and data constructs that provide the functionality of the present disclosure.

Software code modules and instructions that provide the functionality of the present disclosure may be stored in the RAM 970 and the disk drive 980. These software modules may be executed by the processor(s) 960. The RAM 970 and the disk drive 980 may also provide a repository for storing data used in accordance with the present disclosure.

The RAM 970 and the disk drive 980 may include a number of memories including a main random access memory (RAM) for storage of instructions and data during program execution and a read only memory (ROM) in which fixed non-transitory instructions are stored. The RAM 970 and the disk drive 980 may include a file storage subsystem providing persistent (non-volatile) storage for program and data files. The RAM 970 and the disk drive 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method implemented on a computer system to output data from superblocks of a memory, the method comprising:
generating "D" intermediary data bits by at least performing one or more XOR operations on data bits from wordlines of a superblock, wherein:
the wordlines comprise a first wordline and a second wordline, the superblock comprises a first block on a first memory die and a second block on a second memory die,
the first block comprises the first wordline and the second block comprises the second wordline, and
each of the first wordline and the second wordline is configured to store "D" data bits and "P" parity bits,
generating "K" parity bits that protect the "D" intermediary data bits, wherein "K" is equal to the sum of "D" and "P";
storing the "K" parity bits in an additional wordline of the superblock other than the wordlines; and
outputting decoded data bits from the superblock based on a decoding procedure that uses the "K" parity bits stored in the additional wordline.

2. The method of claim 1, wherein outputting the decoded data bits from the superblock comprises:
decoding the wordlines with a first decoder;
determining that a number of error bits in the first wordline is larger than a threshold; and
decoding the first wordline with a second decoder based on the number of error bits being larger than the threshold, wherein the second decoder is associated with a higher error correction capability than the first decoder.

3. The method of claim 2, wherein the "D" data bits and "P" parity bits in each of the wordlines form an error correction code associated with a D/(D+P) code rate, wherein the "D" intermediary data bits and the "K" parity bits form a different error correction code associated with a D/(2D+P) code rate, and wherein the higher error correction capability of the second decoder is based on the D/(2D+P) code rate.

4. The method of claim 1, wherein outputting the decoded data bits from the superblock comprises:
determining a number of failed wordlines;
determining whether the number is equal to or greater than one; and
upon determining that the number is equal to one, performing a first decoding procedure that does not rely on soft information of other wordlines,
upon determining that the number is greater than one, performing a second decoding procedure that relies on soft information of one or more other failed wordlines.

5. The method of claim 1, wherein outputting the decoded data bits from the superblock comprises:
determining that decoding the first wordline failed based on a number of error bits in the decoding of the first wordline;
generating the "D" intermediary data bits again by at least re-performing the one or more XOR operations; and
decoding the first wordline again based on a decoding of the "D" intermediary data bits, wherein the decoding of the "D" intermediary data bits is based on the "K" parity bits.

6. The method of claim 1, wherein outputting the decoded data bits from the superblock comprises:
decoding the first wordline with a first decoder;
determining that the decoding of the first wordline with the first decoder failed;
decoding the "D" intermediary data bits with a second decoder based on the "K" parity bits stored in the additional wordline of the superblock;
generating a second "D" intermediary data bits by at least performing one or more XOR operations on a subset of the wordlines of the superblock, wherein the subset excludes the first wordline; and
decoding the "D" data bits of the first wordline based on the "D" decoded intermediary data bits and the second "D" intermediary data bits.

7. The method of claim 1, wherein outputting the decoded data bits from the superblock comprises:
decoding, in a first iteration, the first wordline and the second wordline with a first decoder;
determining that the decoding of the first wordline and the second wordline with the first decoder failed;

decoding the "D" intermediary data bits with a second decoder based on the "K" parity bits stored in the additional wordline of the superblock; and decoding, in a second iteration, the first wordline with the first decoder based on soft information associated with the second wordline and information associated with the "D" decoded intermediary data bits, wherein the soft information associated with the second wordline is an output from the first decoder in the first iteration, and wherein the information associated with the "D" decoded intermediary data bits is available from the second decoder.

8. The method of claim 7, wherein decoding the first wordline in the second iteration comprises erasing soft information that is associated with the first wordline and that is another output of the first decoder in the first iteration.

9. The method of claim 7, wherein outputting the decoded data bits from the superblock further comprises:
 decoding, in the second iteration and subsequent to the decoding of the first wordline in the second iteration, the second wordline with the first decoder based on soft information associated with the first wordline and the information associated with the "D" decoded intermediary data bits, wherein the soft information associated with the first wordline is another output from the first decoder in the second iteration.

10. The method of claim 7, wherein the information associated with the "D" decoded intermediary data bits comprises log likelihood ratios of the "D" decoded intermediary data bits.

11. The method of claim 7, wherein the information associated with the "D" decoded intermediary data bits comprises hard information of the "D" decoded intermediary data bits.

12. A computer system comprising:
 one or more processors; and
 one or more memories communicatively coupled with the one or more processors and storing instructions that, upon execution by the one or more processors, configure the computer system to at least:
  generate "D" intermediary data bits by at least performing one or more XOR operations on data bits from wordlines of a superblock, wherein:
   the wordlines comprise a first wordline and a second wordline,
   the superblock comprises a first block on a first memory die and a second block on a second memory die,
   the first block comprises the first wordline and the second block comprises the second wordline, and
   each of the first wordline and the second wordline is configured to store "D" data bits and "P" parity bits;
  generate "K" parity bits that protect the "D" intermediary data bits, wherein "K" is equal to the sum of "D" and "P";
  store the "K" parity bits in an additional wordline of the superblock other than the wordlines; and
  output decoded data bits from the superblock based on a decoding procedure that uses the "K" parity bits stored in the additional wordline.

13. The computer system of claim 12, wherein outputting the decoded data bits from the superblock comprises:
 determining a number of failed wordlines;
 determining whether the number is equal to or greater than one; and
 upon determining that the number is equal to one, performing a first decoding procedure that does not rely on soft information of other wordlines,
 upon determining that the number is greater than one, performing a second decoding procedure that relies on soft information of one or more other failed wordlines.

14. The computer system of claim 12, wherein outputting the decoded data bits from the superblock comprises:
 determining that decoding the first wordline failed based on a number of error bits in the decoding of the first wordline;
 generating the "D" intermediary data bits again by at least re-performing the one or more XOR operations; and
 decoding the first wordline again based on a decoding of the "D" intermediary data bits, wherein the decoding of the "D" intermediary data bits is based on the "K" parity bits.

15. The computer system of claim 12, wherein outputting the decoded data bits from the superblock comprises:
 decoding the first wordline with a first decoder;
 determining that the decoding of the first wordline with the first decoder failed;
 decoding the "D" intermediary data bits with a second decoder based on the "K" parity bits stored in the additional wordline of the superblock;
 generating a second "D" intermediary data bits by at least performing one or more XOR operations on a subset of the wordlines of the superblock, wherein the subset excludes the first wordline; and
 decoding the "D" data bits of the first wordline based on the "D" decoded intermediary data bits and the second "D" intermediary data bits.

16. One or more non-transitory computer storage media comprising instructions that, upon execution on a computer system, configure the computer system to perform operations comprising:
 generating "D" intermediary data bits by at least performing one or more XOR operations on data bits from wordlines of a superblock, wherein:
  the wordlines comprise a first wordline and a second wordline,
  the superblock comprises a first block on a first memory die and a second block on a second memory die,
  the first block comprises the first wordline and the second block comprises the second wordline, and
  each of the first wordline and the second wordline is configured to store "D" data bits and "P" parity bits;
 generating "K" parity bits that protect the "D" intermediary data bits, wherein "K" is equal to the sum of "D" and "P";
 storing the "K" parity bits in an additional wordline of the superblock other than the wordlines; and
 outputting decoded data bits from the superblock based on a decoding procedure that uses the "K" parity bits stored in the additional wordline.

17. The one or more non-transitory computer storage media of claim 16, wherein outputting the decoded data bits from the superblock comprises:
 decoding, in a first iteration, the first wordline and the second wordline with a first decoder;
 determining that the decoding of the first wordline and the second wordline with the first decoder failed;
 decoding the "D" intermediary data bits with a second decoder based on the "K" parity bits stored in the additional wordline of the superblock; and decoding, in a second iteration, the first wordline with the first decoder based on soft information associated with the second wordline and information associated with the "D" decoded intermediary data bits, wherein the soft information associated with the second wordline is an output from the first decoder in the first iteration, and wherein the information associated with the "D" decoded intermediary data bits is available from the second decoder.

18. The one or more non-transitory computer storage media of claim 17, wherein decoding the first wordline in the second iteration comprises erasing soft information that is associated with the first wordline and that is another output of the first decoder in the first iteration.

19. The one or more non-transitory computer storage media of claim 17, wherein outputting the decoded data bits from the superblock further comprises:
  decoding, in the second iteration and subsequent to the decoding of the first wordline in the second iteration, the second wordline with the first decoder based on soft information associated with the first wordline and the information associated with the "D" decoded intermediary data bits, wherein the soft information associated with the first wordline is another output from the first decoder in the second iteration.

20. The one or more non-transitory computer storage media of claim 17, wherein the information associated with the "D" decoded intermediary data bits comprises log likelihood ratios of the "D" decoded intermediary data bits.

* * * * *